United States Patent
Ansems et al.

(10) Patent No.: US 8,026,532 B2
(45) Date of Patent: Sep. 27, 2011

(54) SINGLE CHIP LED AS COMPACT COLOR VARIABLE LIGHT SOURCE

(75) Inventors: Johannes Petrus Maria Ansems, Eindhoven (NL); Christoph Gerard August Hoelen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 1147 days.

(21) Appl. No.: 11/720,629

(22) PCT Filed: Nov. 28, 2005

(86) PCT No.: PCT/IB2005/053928
§ 371 (c)(1),
(2), (4) Date: Jun. 1, 2007

(87) PCT Pub. No.: WO2006/061728
PCT Pub. Date: Jun. 15, 2006

(65) Prior Publication Data
US 2010/0109575 A1    May 6, 2010

(30) Foreign Application Priority Data
Dec. 6, 2004    (EP) .................................. 04106320

(51) Int. Cl.
*H01L 33/00* (2010.01)
(52) U.S. Cl. .............. 257/99; 257/79; 257/100; 257/81; 257/98
(58) Field of Classification Search .................. 362/362, 362/631, 630, 632; 314/79–84, 93, 98–103
See application file for complete search history.

(56) References Cited

U.S. PATENT DOCUMENTS

| | | | |
|---|---|---|---|
| 6,547,249 B2 | 4/2003 | Collins et al. | |
| 6,600,175 B1 | 7/2003 | Baretz et al. | |
| 6,633,134 B1 | 10/2003 | Kondo et al. | |
| 2001/0032985 A1 | 10/2001 | Bhat et al. | |
| 2002/0113246 A1 | 8/2002 | Nagai et al. | |
| 2003/0026096 A1 | 2/2003 | Ellens et al. | |
| 2003/0089918 A1 | 5/2003 | Hiller et al. | |
| 2004/0027055 A1 | 2/2004 | Yamazaki et al. | |
| 2004/0061107 A1 | 4/2004 | Duggal | |
| 2004/0140762 A1 | 7/2004 | Tohma et al. | |
| 2006/0258028 A1* | 11/2006 | Paolini et al. ................... | 438/22 |

FOREIGN PATENT DOCUMENTS

JP    2002151250 A    5/2002
WO    WO9957945 A1    11/1999

OTHER PUBLICATIONS

Muthu et al: "Red, Green and Blue LED-Based White Light Source: Implementation Challenges and Control Design"; Industry Applications Conference, 2003. Conference Record of the 38TH IAS Annual Meeting, vol. 1, Oct. 12-16, 2003.

* cited by examiner

Primary Examiner — Tuyet Thi Vo

(57) ABSTRACT

A color variable light-emitting device includes an array of LEDs formed on one highly resistive substrate. The array includes first, second and third set of at least one LED arranged to provide light of first, second and third color, respectively. At least one of the sets is independently addressable. Further, each light-emitting diode in the array has a separate connection to a circuitry, and at least one of the sets includes at least two LEDs, interconnected in series via the circuitry. Thus, all connections between separate LEDs, for example in the same set, can be done via the circuitry allowing for a very dense packing of the LEDs in the array, as no interconnects between different LEDs of the array need to be arranged in the array.

13 Claims, 3 Drawing Sheets

SINGLE CHIP LED AS COMPACT COLOR VARIABLE LIGHT SOURCE

The present invention relates to a color variable array of light-emitting diodes formed on one highly resistive substrate, comprising at least two sets of at least one light-emitting diode, each set emitting light of a separate color.

Light-emitting diodes (LEDs) are becoming attractive alternatives to conventional light bulbs as lighting sources. They are replacing light bulbs in automobile applications such as stop taillights and outdoor signs and traffic signals. They are also starting to replace ordinary light bulbs for room lighting and stage lighting.

Lighting systems employing LEDs have a number of advantages over standard lighting sources, such as having a much longer life span, being more robust, lower operating temperatures and low voltage power requirements.

LED lighting systems for providing, for example, white light typically utilizes multiple LEDs of different colors and the different colors are mixed together to obtain the white light, or light of any other color.

To obtain a good color mixing, it would be advantageous to have the LEDs of different colors in close proximity of each other.

Further, it would be advantageous to be able to easily control the color produced by the lighting device, such as the color temperature of white light.

U.S. Pat. No. 6,547,249 discloses an array of a plurality of separate LEDs formed on one highly resistive substrate. All the LEDs in the array are interconnected. Thus, they provide a plurality of LEDs in close proximity to each other. The '249-patent also disclose an array wherein some of the LEDs in the array are covered by a phosphor to change the color of the light generated by those LEDs. This provides the possibility for producing such LED-arrays having a predetermined color.

However, the color of such an array is fixed, and even small differences in phosphor thickness between arrays lead to different colors and thus a large binning range of such arrays.

Thus, it remains a need for compact LED based lighting systems having good color mixing properties and providing a constant color between individual LED-arrays.

One object of the present invention is to provide means for a LED based lighting system that overcomes the above-mentioned problems. Thus, the present invention provides a color variable light-emitting device that comprises an array of a plurality of light-emitting diodes formed on one highly resistive substrate.

The array comprises a first set of at least one light-emitting diode arranged to provide light of a first color, a second set of at least one light-emitting diode arranged to provide light of a second color and a third set of at least one light-emitting diode arranged to provide light of a third color. The array may also comprise further sets, such as a fourth and a fifth set, of at least one light-emitting diode, to provide light of further colors, such as a fourth and a fifth color respectively.

The array is arranged on a sub-mount that is provided with a circuitry, to which the array of light-emitting diodes is connected.

In the device of the present invention, each light-emitting diode in the array has a separate connection to said circuitry, and at least one of the first, second or third sets comprises at least two light-emitting diodes, interconnected in series via the circuitry.

Further, the circuitry in the device of the present invention comprises external connectors to independently address at least one of the first, second and third sets.

The LEDs of an array according to the present invention are all formed and located on the same substrate. This is to be distinguished from an array of separate LED-dies mounted on a sub-mount.

By forming an array of several LEDs on one highly resistive substrate, rather than an array of several individually sub-mounted LEDs, a more a dense packing of diodes is possible and high light flux may be produced by such an array having a small area. Thus, an illumination system based on light-emitting devices of the invention can be made small because the average brightness of the light-emitting area is high.

It is further advantageous with an array comprising LEDs of different colors having a small area, as color mixing, in order to achieve light of a desired color by mixing light of different colors, is improved by the small area of the array, since the distance between different color emitting sources are located closer to each other.

The array provides light of at least three colors of which the luminous flux of at least one color can be controlled independently from the other two colors. This, together with the possibility for dense packing of LEDs in the array, allows for providing a variable color with good color mixing.

In an array of the present invention, at least one of the sets of at least one LED comprises at least two light-emitting diodes, where the LEDs in such a set of two or more LEDs are interconnected in series.

By connecting LEDs of a set in series, the driving current, and thus the light output, will be constant for all LEDs in the set, contrary to a parallel arrangement, where a small variation in resistance of one LED leads to variation in current through all LEDs in the set, and which may cause very significant light output variations between the individual LEDs in the set. Further, each LED of the array has a separate connection to the circuitry, and thus, all connections between separate LEDs, for example in the same set, can be done via the circuitry. This also allows for a very dense packing of the LEDs in the array, as no interconnects between different LEDs of the array need to be arranged in the array.

To allow for independent addressing of different sets of LEDs in the array, the circuitry comprises external connectors, to which a LED driver unit may be connected, for such independent addressing. In a device according to the invention, the circuitry may comprise several separate, from each other electrically isolated, parts. Such different parts of the circuitry may be used to independently connect to and address different sets of LEDs in the array. In embodiments of the present invention, the sub-mount is a multilayer sub-mount, and different parts of the circuitry are arranged on different layers in the multilayer sub-mount.

For example, different parts of the circuitry connected to different sets of light-emitting diodes may be arranged on different layers of the sub-mount. This may facilitate the patterning of the circuitry, as different parts of the circuitry, driving different sets of LEDs of the array, can be arranged on different layers. Thus, the number of crossing points of different parts of the circuitry is minimized. In embodiments of the present invention, all light-emitting diodes of said array emits light of the same color. To obtain a multicolor array, the light-emitting diode(s) of the first set is provided with a first wavelength-converting compound arranged to convert light emitted by the diode(s) into light of the first provided color. Further, the light-emitting diode(s) of the second set is provided with a second wavelength-converting compound arranged to convert light emitted by the diode(s) into light of the second provided color. One example is when all diodes emit blue light, and the first provided color is green (wavelength converted from blue) and the second provided color is red (wavelength converted from blue). In other embodiments of the present invention, also the light-emitting diode(s) of the third set is provided with a third wavelength-converting compound arranged to convert light emitted by said diode(s) into light of the third provided color. One example is when all diodes emit UV-light, or near-UV light, and the first provided color is green (wavelength converted from UV), the second provided color is red (wavelength converted from UV), and the third provided color is blue (wavelength converted from UV).

The emission (the wavelength distribution and/or the intensity) from certain LEDs of certain intrinsic colors is strongly dependent on the temperature of the LED and/or the current density driving the LED. This presents problems, for example in LED-arrays capable of generating white light, as a small variation in the temperature of or current through the device leads to a variation in the color of the emitted light.

By using suitable wavelength-converting compounds, the most temperature stable LEDs can be utilized and the intrinsic colors can then be converted into the desired color.

Also, the most efficient type of LEDs emitting in the spectral range of UV- to green light can be utilized to pump the wavelength-converting compounds and possibly deliver the primary color with the shortest wavelength of the device.

The wavelength-converting compounds suitable for use in the present invention are preferably essentially temperature independent. The desired wavelength-converting compound may be deposited directly on top of the desired LEDs. The wavelength-converting compound may alternatively be comprised in an area of a layer arranged on the array, where the area at least partly covers the desired LEDs.

Thus, the present invention relates to a color variable light-emitting device comprising an array of a plurality of LEDs formed on one highly resistive substrate, which array comprises a first, a second and a third set of at least one LED arranged to provide light of a first, a second and a third color, respectively. At least one of the sets is independently addressable. Further, each light-emitting diode in the array has a separate connection to a circuitry, and at least one of the sets comprises at least two LEDs, interconnected in series via the circuitry. All connections between separate LEDs, for example in the same set, can be done via the circuitry. This also allows for a very dense packing of the LEDs in the array, as no interconnects between different LEDs of the array need to be arranged in the array.

The present invention will now be further described in the detailed description of preferred embodiments with reference to the accompanying drawings.

Figure 1:
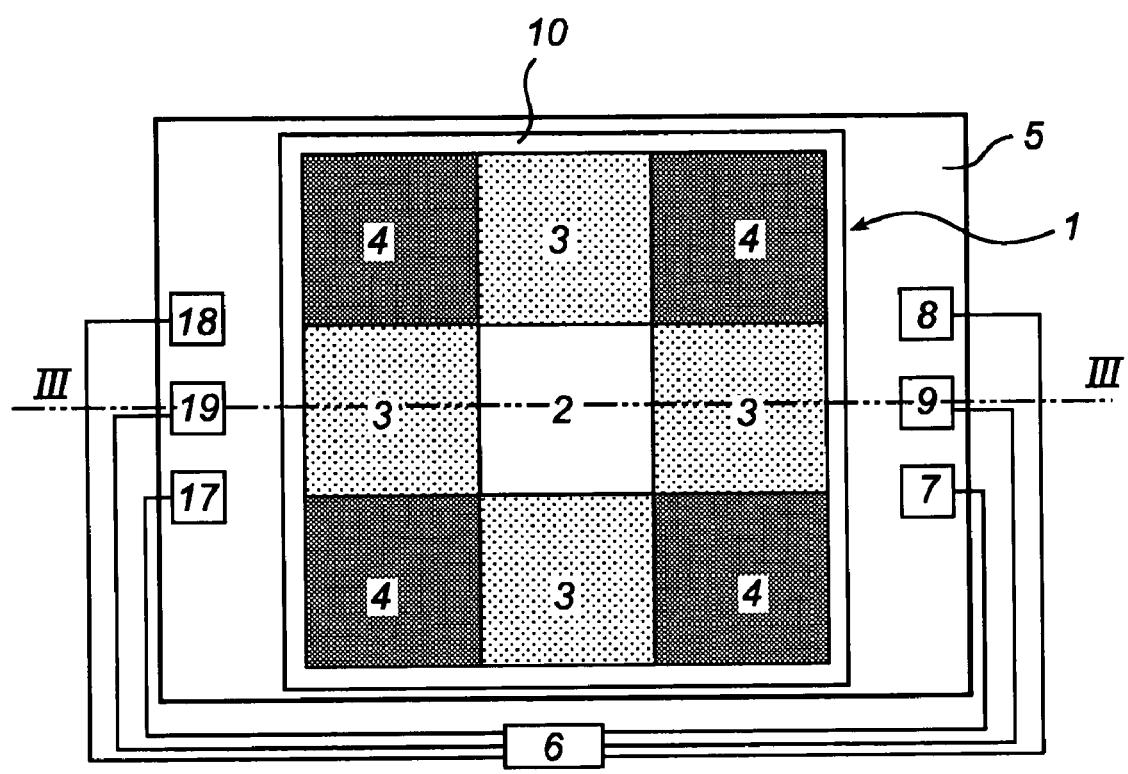
FIG. 1 illustrates a nine-fold array of the present invention comprising a multifold-LED of nine active elements, four of which provide a light of a red color, four of which provide light of a green color and one which provides light of a blue color, arranged in a 3×3 square formation.
Figure 3:
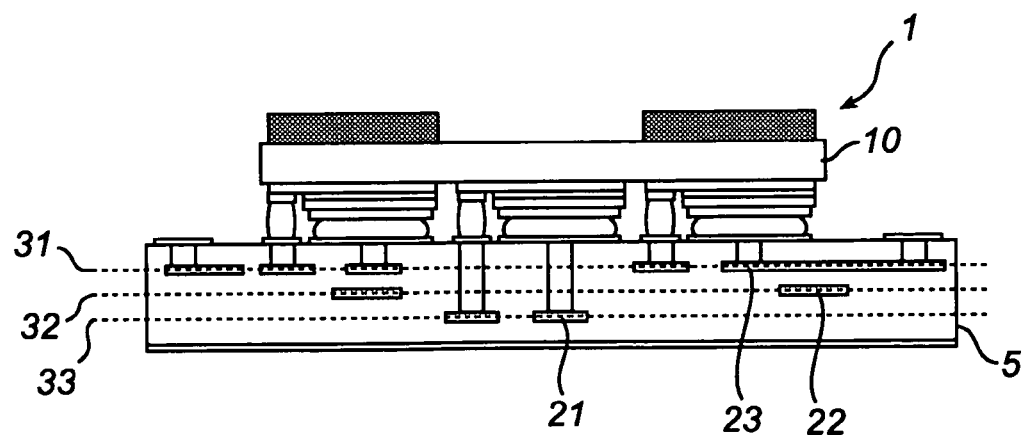

FIG. 3 illustrates, in cross section along line the device in FIG. 1 wherein the circuitry is arranged in a multilayer sub-mount where the circuitry for the red channel is arranged at interconnect layer 1, for the green channel in interconnect layer 2, and for the blue channel in interconnect layer 3. The interconnection between the active LED elements and the interconnect layers is provided by electrical via's through the layers of the multilayer sub-mount.

Figure 4:
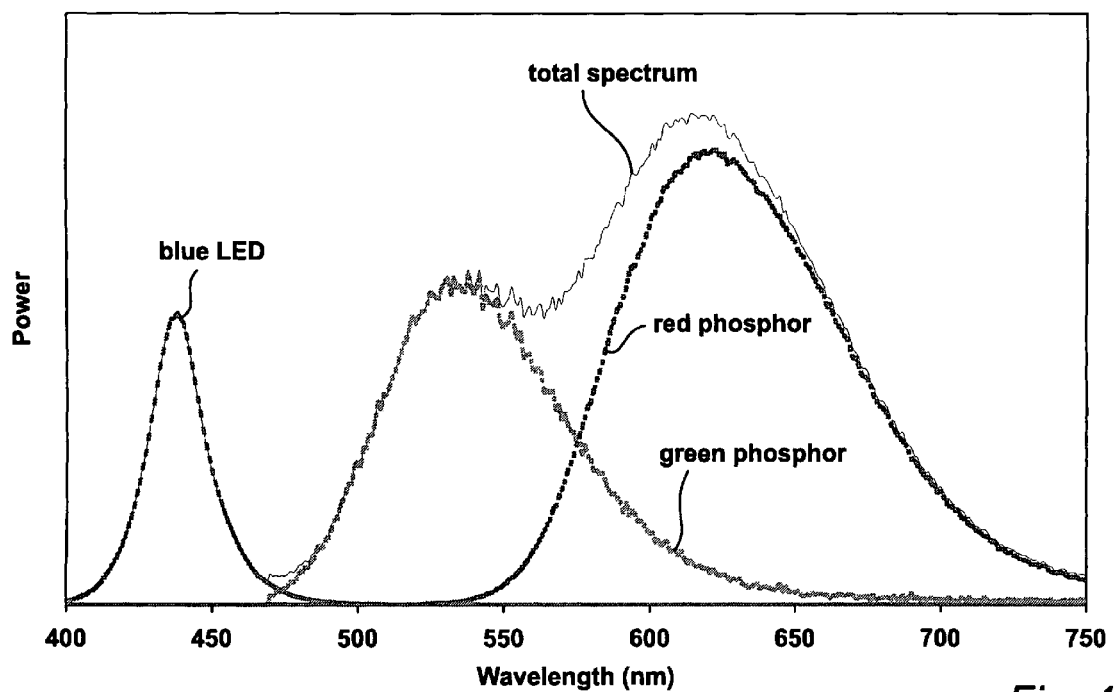

FIG. 4 shows an example of a spectrum from a 3000 K white emitting RGB-array of the invention.

An exemplary embodiment of the invention, as shown in FIG. 1, comprises a nine-fold LED array 1 formed in a 3×3 square on one substrate.

The array is divided into three individual sets of LEDs, one set 2 of one LED providing blue light, one set 3 of four LEDs providing red light, and one set 4 of four LEDs providing green light.

The three sets are separately connected to a LED driver unit 6 which independently can control the voltage and/or current through the three separate sets through the individual connectors for blue 7 (to cathode) and 17 (to anode), green 8 (to cathode) and 18 (to anode) and red 9 (to cathode) and 19 (to anode). Alternatively, either the anodes or the cathodes of the sets of LEDs are connected resulting in only four electrically isolated connections between the LED driver unit and the LED array.

The array in FIG. 1 thus constitutes an RGB-unit that can provide light of any color inside the color space defined by the color points of the blue, green and red sets, respectively. By controlling the current through the different colored sets individually, the total color of the array is variable.

The array is placed on a sub-mount 5 provided with a circuitry that connects to the three sets individually.

Figure 2:
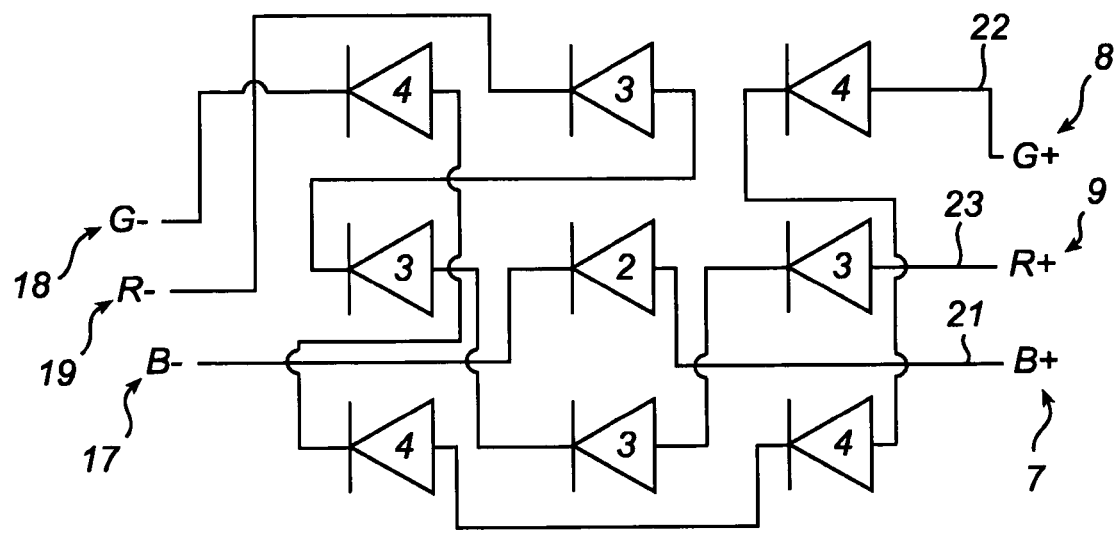
FIG. 2 shows an example of a circuitry for the array in FIG. 1.

The circuitry is schematically shown in FIG. 2, and shows that the three sets are separately connected to different, from each other isolated, parts of the circuitry. The blue LED 2 is connected to a part 21 of the circuitry designated therefore, the green LEDs 3 are connected to a part 22 of the circuitry designated therefore, and the red LEDs 4 are connected to a part 23 of the circuitry designated therefore.

As is shown in FIG. 3, the three sets of circuitry may be arranged on three different layers of a multi-layer sub-mount. Thus, the "red" circuitry 21 is arranged on a first layer 31, the "green" circuitry 22 is arranged on a second layer 32, and the "blue" circuitry 23 is arranged on a third layer 33.

However, the circuitry for one set of LEDs does not need to be restricted in location to a single interconnect layer. Multiple interconnect layers may be used for a set of LEDs of a particular color, using electrical via's between the interconnect layers and through one or more layers of the multilayer sub-mount. In some configurations this may be advantageous, e.g. to reduce the number of interconnect layers and thus to reduce the thickness of the multilayer sub-mount, which can lead to a reduced thermal resistance of the sub-mount. Typically, a multifold LED-array of the present invention comprises a multitude of active elements (LEDs) which are all formed on the same substrate, and which are one integral part by the common substrate. Thus, all LEDs in the array emit light of the same color.

Suitable substrates include highly resistive substrates, such as for example sapphire, silicon carbide or gallium nitride. The LEDs may be formed on the substrate by growing the semi-conductor layers needed for the formation of light-emitting diodes on the substrate by chemical vapor deposition (CVD), molecular beam epitaxy (MBE) or any other suitable method. Furthermore, the substrate is preferably a substrate with low optical absorption.

Examples of suitable LEDs include, but are not limited to, GaN, AlGaN, InGaN and AlInGaN diodes.

Each LED element of the array preferably has its own set of connectors from the anode and the cathode of the element to the interconnecting circuit providing the series connection of the elements of a set of LEDs (emitting substantially the same color or wavelength converted color). Preferably, the elements (LEDs) are formed such that the connectors to the anode and the cathode are arranged on the same side of the LED-array, opposite from the light-propagation side. Thus, all the circuitry for driving the LED array may be arranged on one side on the array, not blocking any of the emitted light.

The array shown in FIG. 1 comprises nine active elements (LEDs). However, arrays of more or fewer LEDs, formed on one substrate and in any geometrical configuration, are also encompassed by the scope of the appended claims. Furthermore, not only the geometry and number of active elements may be different from that shown in FIG. 1, but also the size of individual elements may vary within a multifold-LED array, e.g. to optimize color mixing and required luminous flux contributions of the various colors at the same time. In a multifold-LED array of the present invention, all LEDs emit light of essentially the same color. In order to provide a multicolor array, the light emitted by the LEDs of the array, the intrinsic color, has to be converted into the different colors of the multicolor array.

Wavelength-converting compounds, or phosphors, are luminescent compounds that absorb light of a wavelength or a wavelength interval and emit light of a different wavelength or wavelength interval. Many such luminescent compounds are known to those skilled in the art. The term "luminescent compound" refers to both phosphorescent compounds and fluorescent compounds.

Such wavelength-converting compounds may be used to convert the intrinsic color into the different colors of the multicolor array.

The term "intrinsic color", as used herein, refers to the color emitted directly by the LED and depends on the materials used for forming the LED on the substrate, as is known by those skilled in the art.

The three different colors of the LEDs in the array shown in FIG. 1 may be realized in several ways.

For example, in the case of active elements (LEDs) emitting UV-light or near-UV-light, the blue channel is formed by providing the elements in the blue set with a UV-to-blue converting compound. The green and the red channels are consequently formed by providing the elements in the green and red sets with a UV-to-green and a UV-to-red converting compound respectively.

In another case, where the active elements (LEDs) emit blue light, the blue channel is not provided with any wavelength-converting compound, and the green and the red channels are consequently formed by providing the elements in the green and red sets with a blue-to-green and a blue-to-red converting compound respectively. A wavelength spectrum from a RGB array of according to this embodiment with intrinsic blue channel and wavelength converted green and red channels, producing white light of color temperature 3000 K, is shown in FIG. 4.

Such wavelength-converting compounds as the above mentioned blue-to-green, blue-to-red, UV-to-blue, UV-to-green and UV-to-red converting compounds, as well as other wavelength-converting compounds are known to those skilled in the art.

The array in FIG. 1 is an RGB-array. However, the present invention is not in any way limited to the use of the combination of blue, green and red to form a multicolor array. Other colors and combinations of colors may also be used in the device of the present invention, for example 3-color combinations, such as cyan, green and red; cyan, yellow and red; and blue, yellow and red; color combinations including white, for example by allowing leakage of blue through a yellow phosphor layer, such as white, green and red; and white, yellow and red; or four-color combinations, such as white, blue, green, red; and blue, cyan, green, red.

Preferably, the intrinsic color of the LEDs of the array of the invention is UV, near-UV or blue, since light with low wavelength easily can be converted into light of higher wavelength. Preferably, one of the provided colors are in the amber-red spectral range, to allow all the color points of the black body locus to be generated.

Examples of fluorescent materials converting blue light into red light include those selected from the group formed by SrS:Eu, $Sr_2Si_5N_8$:Eu, CaS:Eu, $Ca_2Si_5N_8$:Eu, $(Sr_{1-x}Ca_x)S$:Eu and $(Sr_{1-x}Ca_x)_2Si_5N_8$:Eu and (x=0-1). A suitable luminescent material is $Sr_2Si_5N_8$:Eu that exhibits a relatively high stability. In addition, $Sr_2Si_5N_8$:Eu is a luminescent material, which avoids the use of sulfides. SrS:Eu has a peak wavelength of approximately 610 nm, $Sr_2Si_5N_8$:Eu has a peak wavelength of approximately 620 nm, CaS:Eu has a peak wavelength of approximately 655 nm, whereas $Ca_2Si_5N_8$:Eu has a peak wavelength of approximately 610 nm.

Examples of fluorescent materials converting blue light into green light includes those selected from the group formed by $(Ba_{1-x}Sr_x)_2SiO_4$:Eu (x=0-1, preferably x=0.5), $SrGa_2S_4$:Eu, $Lu_3Al_5O_{12}$:Ce and $SrSi_2N_2O_2$:Eu. In terms of stability, $Lu_3Al_5O_{12}$:Ce and $SrSi_2N_2O_2$:Eu are very suitable luminescent material. In addition, these latter luminescent materials avoid the use of sulfides. $(Ba_{0.5}Sr_{0.5})_2SiO_4$:Eu has a peak wavelength of approximately 523 nm, $SrGa_2S_4$:Eu has a peak wavelength of approximately 535 nm, $Lu_3Al_5O_{12}$:Ce has peak wavelengths at approximately 515 nm and 545 nm, whereas $SrSi_2N_2O_2$:Eu has a peak wavelength of approximately 541 nm.

An example of a suitable yellow/amber emitting luminescent material is $(Y_{1-x}Gd_x)_3(Al_{1-y}Ga_y)_5O_{12}$:Ce (x and y is preferably in the range 0-0.5) with a peak wavelength in the range from 560-590 nm depending on the values of x and y in the chemical formula.

The use of wavelength-converting compounds, such as the above mentioned, to provide light of several colors, gives several advantages over using LEDs having different intrinsic colors.

For example, the wavelength range of widely used AlInGaP diodes, emitting an amber-red light, is temperature sensitive. Thus, the color rendering index of an array comprising such diodes change significantly with temperature. Furthermore, the AlInGaP-material is temperature sensitive, and cannot stand high temperatures. For example, increasing the temperature from 25° C. to 100° C. of an AlInGaP diode decreases the luminous output from the diode with a factor of approximately 2.

Thus, by utilizing wavelength-converting compounds, which are temperature stable, both regarding the wavelength intervals and degradation, the selected color point of the mixed emitted light is hardly or not depending on the temperature, because phosphors with very little thermal quenching in the operating range of temperatures are available, and all colors are generated either directly or via a wavelength-converting compound by the same type of LED.

The wavelength-converting compound is preferably arranged in optical contact with the LED-element whose light it will convert.

The wavelength-converting compounds may be deposited directly on the desired active elements of the LED array. Different methods for deposition are known to those skilled in the art and include dispensing, spraying, screen-printing and electrophoretic deposition of the compound.

Further, a mosaic of pre-shaped platelets containing the wavelength-converting compounds may be mounted on, and optically connected to, the LED array. In this case, the wavelength-converting compound is embedded in an optical matrix such as an optical polymer, a sol-gel glass, or a low-temperature melt glass. Alternatively, the phosphor is applied as ceramic platelets with a suitable optical interconnect between the ceramic platelets and the LEDs.

The wavelength-converting compounds may for example be deposited in a sol-gel matrix to withstand higher operating temperatures.

Walls may be lithographically manufactured around each active element of the array, to provide wells in which the wavelength-converting compounds may be deposited. Such walls may also provide prevention of cross talk between adjacent LEDs.

In other instances, the wavelength-converting compounds may be arranged on a film, which in turn is arranged on top of the array. Such a film may be a polymer film, such as of silicone. Alternatively, the wavelength-converting compounds may be arranged on a glass plate or on a translucent or transparent ceramic plate that is arranged on top the LED array. Preferably, the film or plate is mounted with the wavelength-converting compound situated between the film or plate and the LED array.

In the embodiment shown in FIGS. 1 and 2, all three color-sets are independently addressable. This allows for a free choice of color in the color space defined by the three provided colors. However, according to the present invention, the case may also be that only one color-set is independently addressable, and that the other two or more color-sets are addressed together. In such a case, the color provided by the array can be chosen along the line in the color space, which is determined by the color points of the independently addressable color-set and of the two or more color-sets that are driven in a fixed ratio. By variation of the relative contribution of the two linked colors in respect to the independent color, any color point on this line can be obtained. The array of the invention is arranged on a sub-mount that is provided with a circuitry. Suitable sub-mount materials include, but are not limited to, electrically isolating materials, such as silicon and AlN.

Electrically insulating layers, such as silicon oxide, may be provided to further insulate the LEDs and the electrical lead or interconnects.

Preferably, the sub-mount material is highly thermally conductive to spread and conduct the heat away from the LEDs. Preferably, the sub-mount has a relatively low coefficient of thermal expansion (CTE), which approaches the CTE of the LEDs to enable reliable and robust mounting of the LEDs on the sub-mount. Preferably, the sub-mount is mounted with good thermal contact to a further heat spreader, heat conductor, heat transportation unit or heat sink. Metals such as aluminum or copper, or composites such as aluminum silicon carbide are preferred.

The sub-mount is provided with a circuitry, such that each LED of the multifold-LED array may have a separate connection to the circuitry. The circuitry comprises a pattern of an electrical conducting material, such as, but not limited to, a metal, for example aluminum, lead, tungsten, molybdenum or copper, or a non-metallic electrically conducting material. The circuitry further comprises connectors that are suitable for connection to the active elements of the array. Such connectors may be arranged on the surface of the sub-mount.

All connections to or from each LED are done via the circuitry. Also interconnections between LEDs in the array, such as between LEDs in the same color-set, are done via the circuitry. Thus there is no need to include such interconnects in the design of the array itself, as this is easily handled by the circuitry in the sub-mount for any array layout.

This also allows for a very dense packing of the LEDs in the array, as no interconnects between different LEDs of the array need to be arranged in the array.

The design of the circuitry will depend on the design of the multifold-LED array to be connected to the circuitry.

As shown in FIG. 3, separate parts of the circuitry may be arranged on separate layers of a multilayer sub-mount. This facilitates the patterning of the circuitry, as all crossings between different parts of the circuitry are done in separate layers, and are thus isolated from each other by the sub-mount material.

A multi-layer sub-mount may be composed of electrically insulating ceramic layers, such as aluminum oxide, aluminum nitride, or beryllium oxide.

By connecting the LEDs of a set in series, the drive current is kept at reasonable low levels of e.g. less than 1 A, enabling application of electrical leads with relatively small cross sections without causing significant electrical losses in these leads due to heat dissipation.

Would, e.g., 10 LED elements be connected in parallel, and would the individual LED element be driven by a maximum current of 1 A, then the power supply should deliver a current of 10 A, for which leads with a large cross section would be required. Delivering such high currents in pulse width modulation (PWM) at sufficiently high modulation frequencies is a very hard task, while PWM is a preferred way of driving LEDs.

The above description of preferred embodiments is provided for illustrative purposes only, and is not intended to limit the scope of the invention. Several modifications to and variants of the above-described embodiments will be apparent to those skilled in the art, for example, the present invention relates to a lighting device comprising a multitude of light-emitting devices of the invention. Moreover, several variants of the components of the array are possible, such as other wavelength-converting compounds, substrate materials etc.

The invention claimed is:

1. A color variable light-emitting device, comprising:
an array of a plurality of light-emitting diodes formed on a resistive substrate so that said plurality of light-emitting diodes share said resistive substrate, said array comprising at least first, second and third sets including at least a first set of at least one light-emitting diode arranged to provide light of a first color, a second set of at least one light-emitting diode arranged to provide light of a second color and a third set of at least one light-emitting diode arranged to provide light of a third color; and
a sub-mount on which resistive substrate including said array is arranged, said sub-mount being provided with a circuitry, to which said array of the plurality of light-emitting diodes is connected, wherein each light-emitting diode in said array has a separate connection to said circuitry;
wherein at least one set of said at least first, second and third sets comprises at least two light-emitting diodes, interconnected in series via said circuitry; and
wherein said circuitry comprises external connectors to independently address one set of said at least first, second and third sets.

2. The device according to claim 1, wherein said sub-mount is a multilayer sub-mount and said circuitry is arranged partly on a first layer of the sub-mount and partly on a second layer of the sub-mount.

3. The device according to claim 1, wherein said circuitry comprises a first part and a second part, said first part being connected to said independently addressable one set, and being electrically isolated from said second part.

4. The device according to claim 3, wherein said first part of said circuitry is arranged on a first layer of the sub-mount and said second part of said circuitry is arranged on a second layer of the sub-mount.

5. The device according to claim 1, wherein the at least one light-emitting diode of said first set is provided with a first wavelength-converting compound arranged to convert light emitted by said at least one light-emitting diode of said first set into light of said first provided color, and the at least one light-emitting diode of said second set is provided with a second wavelength-converting compound arranged to convert light emitted by said at least one light-emitting diode of said second set into light of said second provided color.

6. The device according to claim 5, wherein the light emitted by said at least one light-emitting diode of said first set and by said at least one light-emitting diode of said second set is blue light, and wherein said first provided color is green and said second provided color is red.

7. The device according to claim 5, wherein the at least one light-emitting diode of said third set is provided with a third wavelength-converting compound arranged to convert light emitted by said at least one light-emitting diode of said third set into light of said third provided color.

8. The device according to claim 7, wherein the light emitted by said at least one light-emitting diode of said first set, by said at least one light-emitting diode of said second set, and by and said at least one light-emitting diode of said third set is UV-light, and wherein said first provided color is green, said second provided color is red, and said third provided color is blue.

9. An array according to claim 5, wherein said first wavelength-converting compound is deposited on said at least one light-emitting diode of said first set, and said second wavelength-converting compound is deposited on said at least one light-emitting diode of said second set.

10. The array according to claim 5, wherein said wavelength-converting compound is arranged in an area of a layer which is arranged on said array, said area covering at least part of said at least one light-emitting diode of said first set and said at least one light-emitting diode of said second set.

11. The array of claim 1, wherein the sub-mount comprises a first layer, a second layer and a third layer, said first set being connected to a first part of the circuitry in the first layer, said second set being connected to a second part of the circuitry in the second layer, and said third set being connected to a third part of the circuitry in the third layer.

12. The array of claim 11, wherein the at least two light-emitting diodes are interconnected in series via said circuitry in one of the first layer, second layer and third layer.

13. The array of claim 11, wherein the first layer provides interconnection to diodes providing the first color, the second layer provides interconnection to diodes providing the second color, and the third layer provides interconnection to diodes providing the third color.

\* \* \* \* \*